United States Patent
Lu

(10) Patent No.: US 7,929,286 B2
(45) Date of Patent: *Apr. 19, 2011

(54) REDUNDANT POWER SYSTEM OUTPUT STRUCTURE

(75) Inventor: Shao-Feng Lu, Taoyuan Hsien (TW)

(73) Assignees: FSP Technology Inc., Taoyuan, Taoyuan Hsien (TW); 3Y Power Technology (Taiwan), Inc., Gueishan Shiang, Taoyuan Hsien (TW)

( * ) Notice: Subject to any disclaimer, the term of this patent is extended or adjusted under 35 U.S.C. 154(b) by 142 days.

This patent is subject to a terminal disclaimer.

(21) Appl. No.: 12/352,874

(22) Filed: Jan. 13, 2009

(65) Prior Publication Data

US 2010/0177466 A1    Jul. 15, 2010

(51) Int. Cl.
*G06F 1/16* (2006.01)

(52) U.S. Cl. .......... 361/679.22; 439/489; 320/111; 345/211

(58) Field of Classification Search .......... 439/607, 439/374, 489, 272; 361/679.01, 679.02, 361/679.33, 679.22, 728; 320/101, 103, 320/107, 110, 111; 345/163, 175, 211; 165/80.2, 165/200

See application file for complete search history.

(56) References Cited

U.S. PATENT DOCUMENTS

| 2004/0257762 A1* | 12/2004 | Shih ............................ 361/687 |
| 2007/0082550 A1* | 4/2007 | Hemmah et al. .............. 439/607 |
| 2010/0177465 A1* | 7/2010 | Lu ............................ 361/679.01 |

FOREIGN PATENT DOCUMENTS

TW    562163    11/2003

* cited by examiner

*Primary Examiner* — Hung V Duong
(74) *Attorney, Agent, or Firm* — Winston Hsu; Scott Margo

(57) ABSTRACT

An output structure for a redundant power system includes at least two power supplies, a first circuit board and a second circuit board. The power supplies and the first circuit board have respectively a first connection port and a second connection port that correspond and connect to each other. The second connection ports are electrically connected to at least one conductive element to conduct output of the power supplies. The conductive element has another end transporting power to the second circuit board. The second circuit board has at least one transformation circuit to regulate the power passing through the conductive element to form at least one output power to a load. Through the first and second circuit boards, the power of multiple power supplies can be clustered and transformed and delivered. Heat dissipation improves and the size can be shrunk, and insulation density between circuit elements can be maintained.

13 Claims, 5 Drawing Sheets

REDUNDANT POWER SYSTEM OUTPUT STRUCTURE

FIELD OF THE INVENTION

The present invention relates to a redundant power system output structure and particularly to a structure for a redundant power system to cluster a plurality of power supplies and integrate output.

BACKGROUND OF THE INVENTION

A conventional redundant power system usually consists of multiple sets of power supplies that share a common chassis. Namely the power supplies have a common housing and a power integration back panel for control. In practice, it is called an N+M structure, where N is the number of power supplies to be clustered to meet total loading requirement of industrial computers, and M is the number of the power supplies allowed to be disabled. Take 2+1 structure as an example. It consists of three sets of power supplies. The 1 at the rear means that one power supply may be disabled while other power supplies can still provide regular power needed. Depending on different requirements, an N+2 structure may also be adopted.

R.O.C. patent publication No. 562163 entitled "Redundant power supply" has a housing 10 and more than one track room 14 inside to position more than one power supply 30 connecting to a plurality of connectors 12 on a circuit board 11. The circuit board 11 integrates output power of the power supplies 30 to form a redundant power supply.

The circuit board 11 previously discussed is the "back panel" commonly called in the redundant power supply. It mainly aims to integrate the power of multiple power supplies and also transform the power to supply output power of more than one different potential. To meet the prevailing trend that demands slim and light, the redundant power system also has to be made compact. Hence the individual power supplies have to be made smaller, and the back panel also has to be shrunk. Such a demand creates problems in practice, notably:

First, to shrink the circuit board is difficult. As the back panel has to provide two basic functions of power integration and transformation, significant amount of power and current are converged on the back panel. Hence a sufficient insulation capability has to be provided to meet safety regulations. Shrinking the size generally reduces the insulation capability, and voltage-resistance and insulation specifications of circuit elements also have to be enhanced. All this makes design more difficult and cost higher.

Second, heat dissipation also is more difficult. Given the same amount of current and power integration and transformation, heat dissipation on the smaller back panel is more difficult. Moreover, the dimensions of electronic elements for a greater current also are larger, hence the heat dissipation space for airflow is smaller. The smaller back panel has a higher power density in a unit area and a smaller area in contact with the air, and results in poorer heat dissipation of elements. As a result, malfunction probability increases.

SUMMARY OF THE INVENTION

In view of the problems occurred to the conventional redundant power system at a smaller size, the primary object of the present invention is to provide an assembly and output structure coupling with a plurality of power supplies.

The present invention provides an output structure for a redundant power system which includes at least two power supplies. The power supplies are installed in a housing and have respectively a first connection port. The redundant power system has a first circuit board and a second circuit board. The first circuit board has a plurality of second connection ports corresponding and connecting to the first connection ports. The second connection ports are electrically connected to at least one conductive element to conduct output of the power supplies. The conductive element also is connected to the second circuit board to transport output power of a primary power supply. The second circuit board has at least one transformation circuit to regulate the power passing through the conductive element to become at least one output power sent to a load. Thereby, through the first circuit board and the second circuit board the power of the multiple power supplies can be clustered and transformed to be output. The first and second circuit boards can displace the conventional back panel to distribute power density and increase air contact area, therefore improve heat dissipation. Moreover, due to smaller power density and increased surface area of the first and second circuit boards, a sufficient insulation capability can be obtained between circuit elements even the first and second circuit boards are shrunk to a smaller size.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Figure 1:
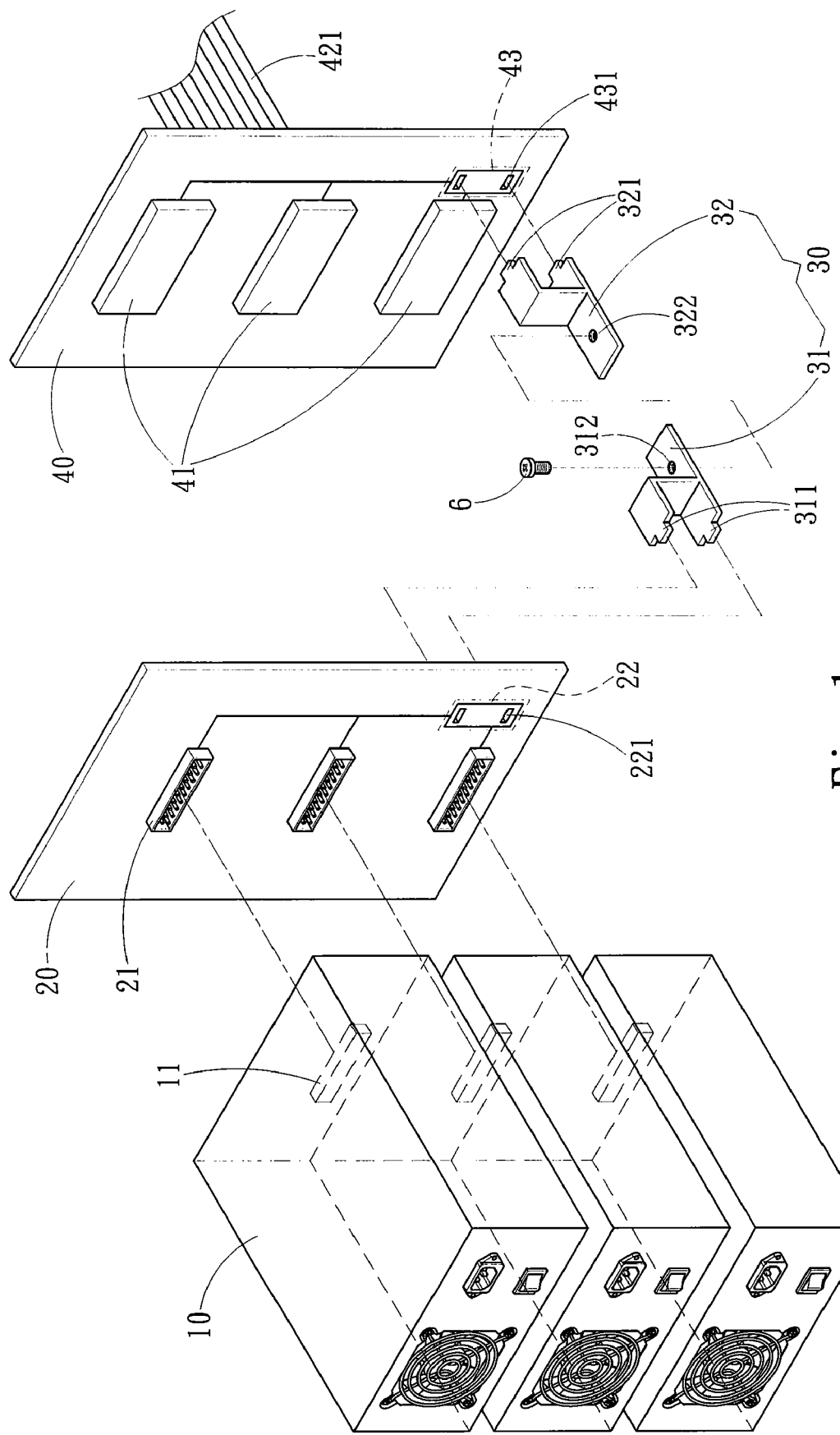
FIG. 1 is a schematic view of the invention in a connecting condition.
Figure 2:
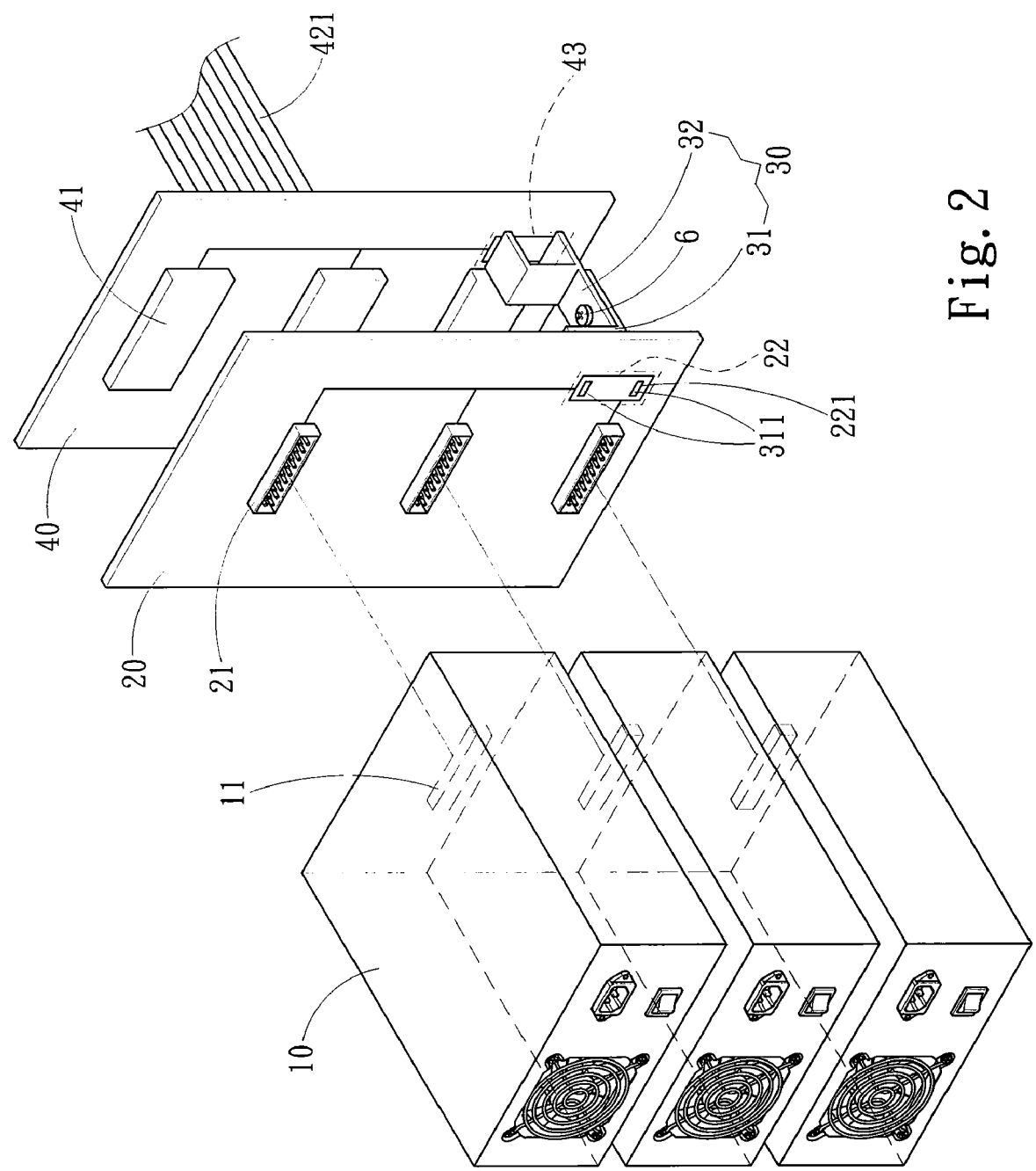
FIG. 2 is a schematic view of the invention in another connecting condition.
Figure 3:
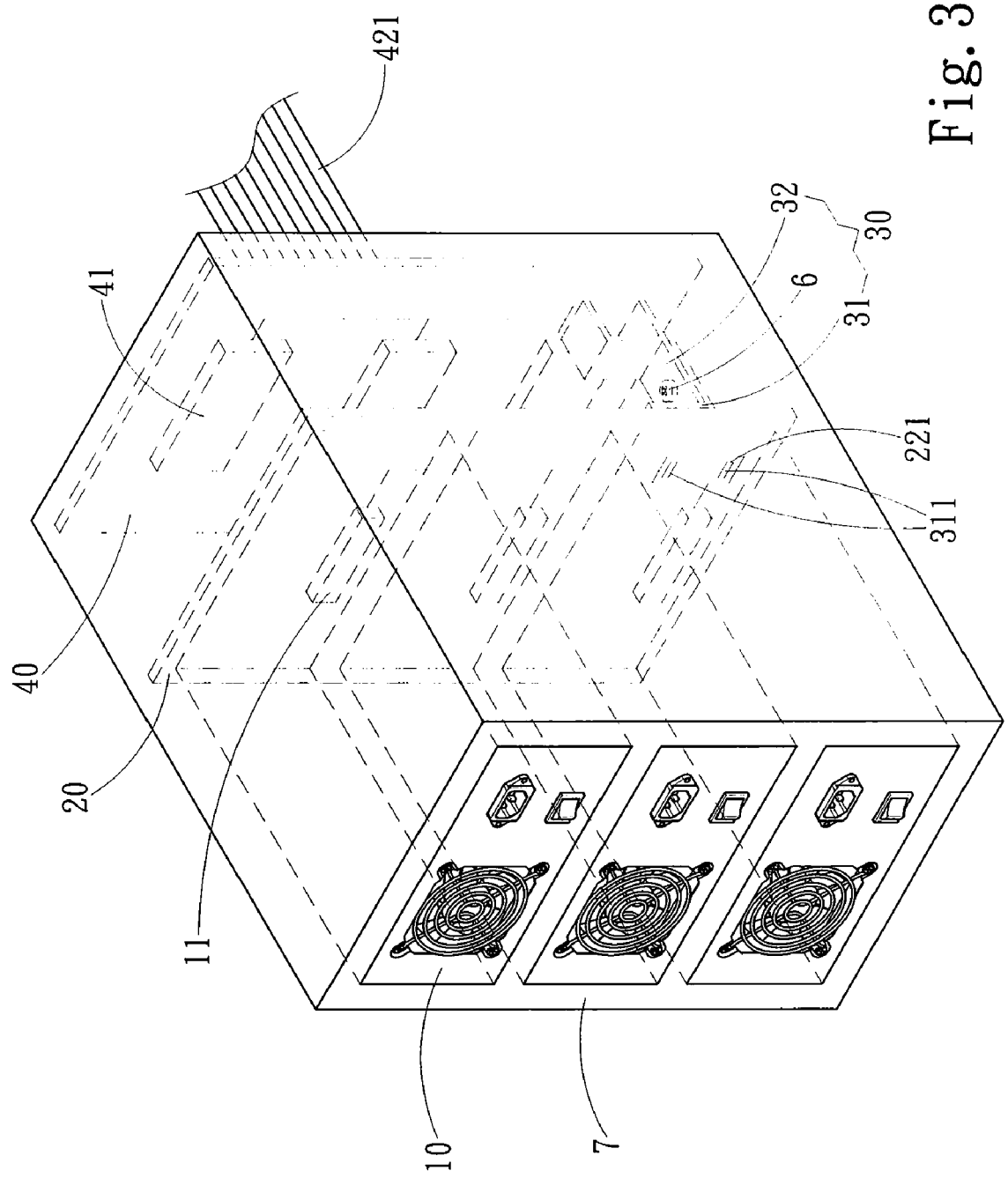
FIG. 3 is a schematic view of an embodiment of the invention.
Figure 4:
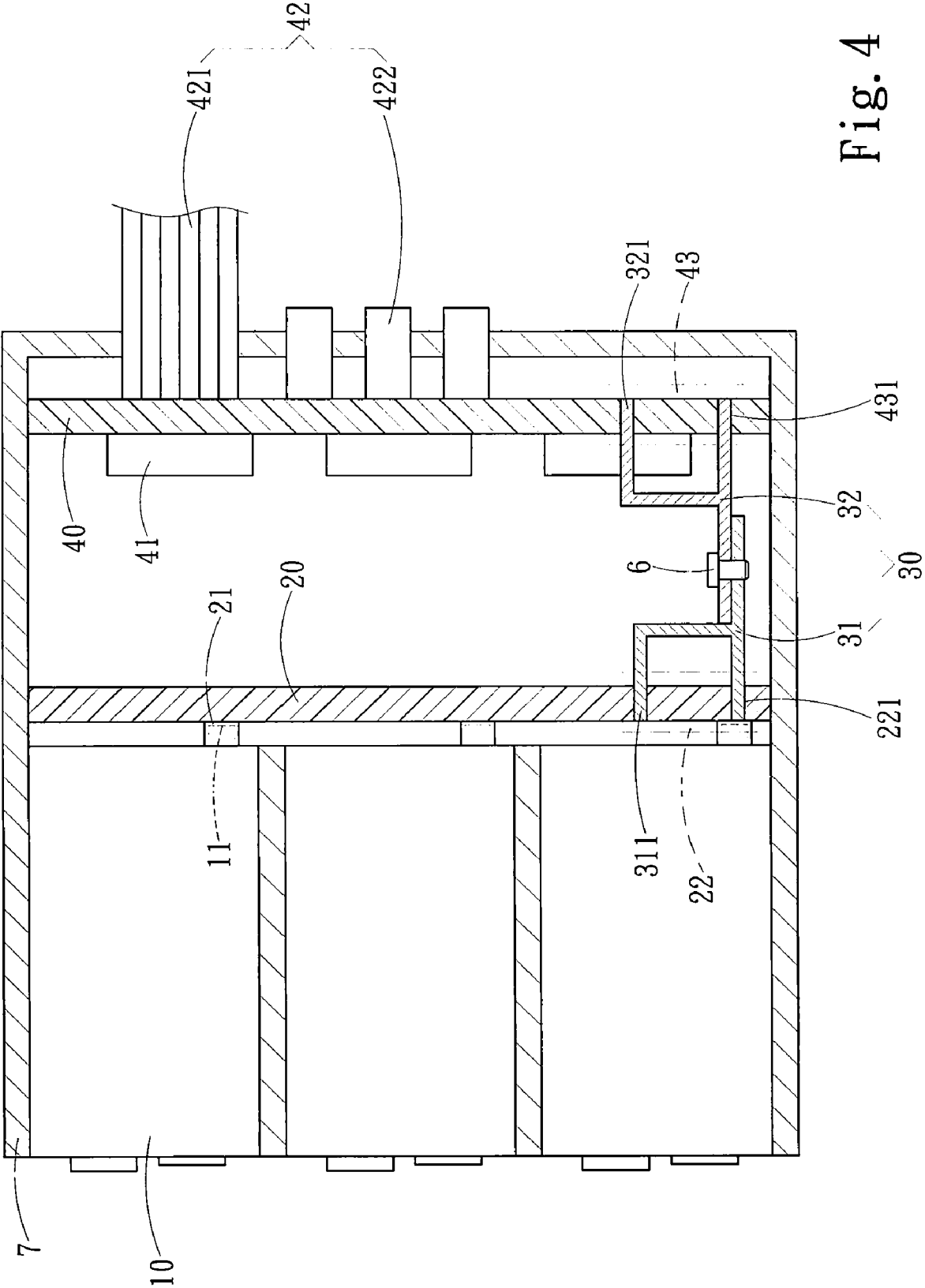
FIG. 4 is a sectional view of an embodiment of the invention.
Figure 5:
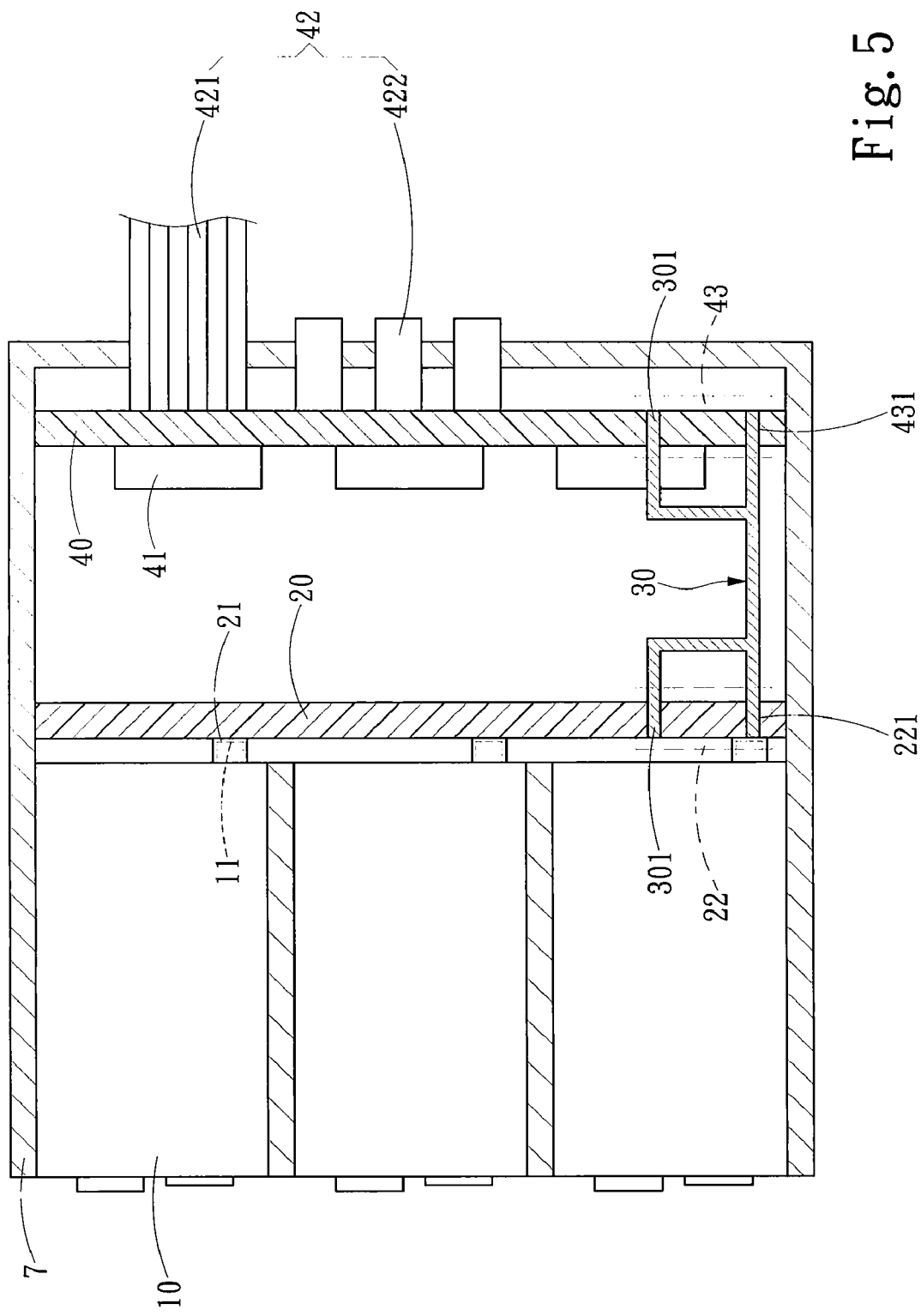
FIG. 5 is a sectional view of another embodiment of a conductive element of the invention.

Please refer to FIG. 1, the redundant power system according to the invention consists of at least two power supplies 10 to provide electric power. The power supplies 10 are installed in a housing 7 (as shown in FIGS. 3 and 4). Each of the power supplies 10 has a first connection port 11 to supply the power. The redundant power system further has a first circuit board 20 and a second circuit board 40. The first circuit board 20 has a plurality of second connection ports 21 corresponding and connecting to the first connection ports 11. Hence the power supplies 10 can deliver the power and conduct to the first circuit board 20 through the electrically connected first connection ports 11 and second connection ports 21. The first circuit board 20 coupled with the power supplies 10 also is electrically connected to the second circuit board 40 through at least one conductive element 30. The first and second circuit boards 20 and 40 have respectively an anchor zone 22 and 43 electrically connected to the conductive element 30. The anchor zones 22 and 43 have respectively at least one anchor hole 221 and 431 to be wedged in and connected by the conductive element 30. The connection may be a compact coupling or soldering. To facilitate assembly and installation, the conductive element 30 may include one or more metal conductors 31 and 32 coupling together (referring to FIG. 1 in which two metal conductors 31 and 32 are provided). The metal conductors 31 and 32 have respectively a connection end 312 and 322 at the juncture with a corresponding screw hole formed thereon to be fastened together through a fastening element 6 to become the conductive element 30 connecting the first and second circuit boards 20 and 40. The conductive element 30 has at least one anchor end 311 and 321 corresponding and electrically connected to the anchor zones 22 and 43 of the first and second circuit boards 20 and 40. Thereby power can be transferred between the first and second circuit boards 20 and 40 through the conductive element 30. In an embodiment previously discussed, the second circuit board 40 is located at one side of the first circuit board 20 in a parallel manner. The conductive element 30 bridges the first and second circuit boards 20 and 40 sideward without occupying the space thereof. FIG. 2 illustrates a condition of the first and second circuit boards 20 and 40 connecting by the conductive element 30. Through the conductive element 30, power of all power supplies 10 on the first circuit board 20 can be transmitted to the second circuit board 40. The second circuit board 40 further has at least one transformation circuit 41 to regulate the power passing through the conductive element 30 so that at least one output power is formed and delivered. The second circuit board 40 also has a plurality of power output portions 42 (also referring to FIGS. 4 and 5) that are electrically connected to the transformation circuit 41 to deliver the output power provided by the transformation circuit 41 to drive a load (not shown in the drawings). The power output portions 42 may include a plurality of power cords 421 or output ports 422 (referring to FIGS. 4 and 5) that are configured independently or in a mixed manner according to requirements. In short, referring to an embodiment shown in FIG. 3, the housing 7 accommodates at least one power supply 10. The first and second circuit boards 20 and 40 are electrically connected through the conductive element 30. The power supplies 10 send the power to the first circuit board 20 through the first connection port 11. The power is clustered on the second circuit board 40 and regulated to become the output power and delivered through the power output portion 42. It is to be noted that the second circuit board 40 has one or more transformation circuit 41 to respectively provide individual output powers to the different power output portions 42 of at least two different potentials. The structure thus formed can provide the output power in various types. The first type is having at least one transformation circuit 41 on the second circuit board 40 with the power output portions 42 respectively and electrically connecting to the second circuit board 40 and the transformation circuit 41 so that output power is received through the conductive element 30 and delivered through the second circuit board 40, and transformed by the transformation circuit 41 to become output power of varying potentials. Namely, the second circuit board 40 receives the power from the conductive element 30 at a potential not yet be transformed and delivers directly to the power output portion 42. The transformation circuit 41 on the second circuit board 40 also transforms the power to be sent to the power output portion 42. The second type is having the second circuit board 40 to receive the power from the conductive element 30 and transform all received power through the transformation circuit 41 and sent to the power output portion 42 to deliver more than one output power. The transformation circuit 41 may include multiple sets to provide the output power at varying potentials. As a conclusion, the second circuit board 40 has at least one transformation circuit 41 to provide at least one transformed output power. It also may receive the power from the conductive element 30 and directly deliver the output power without transformation to meet requirements of varying output voltages.

Referring to FIG. 4, the redundant power system is encased by the housing 7, and the power supply 10 is connected to the first circuit board 20. Through the conductive element 30, power is sent to the second circuit board 40 regulated and output. As previously discussed, by reducing the power density and increasing the air contact area, heat dissipation effect improves. Moreover, the first and second circuit boards 20 and 40 are spaced from each other to allow sufficient airflow to pass through that also enhances heat dissipation. The invention, by incorporating with the smaller power supply 10, can be adopted on a thinner redundant power system.

While the preferred embodiments of the invention have been set forth for the purpose of disclosure, they are not the limitations of the invention. For instance, in the drawings the metal conductors 31 and 32 of the conductive element 30 are coupled through the screw hole and fastening element 6, but other coupling methods also can be adopted to achieve similar effect. The conductive element 30 may also be an integrated element with at least two anchor ends 301 (referring to FIG. 5). While the redundant power system is defined to include at least two power supplies 10 in the invention previously discussed, the number of the power supplies 10 can be set by users as desired. For a power supply of a smaller capacity, the redundant power system can be formed by a real power supply coupling with a virtual power supply. Such a technique is known in the art. Hence the power supply 10 of the invention also can include at least one real power supply and at least one virtual power supply (the virtual power supply is formed in a profile the same as the real power supply, hence FIGS. 1 through 5 also are applicable). Therefore modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. An output structure for a redundant power system which has at least two power supplies encased in a housing, and each of the power supplies having a first connection port, the redundant power system further comprising:
    a first circuit board which has a plurality of second connection ports corresponding and connecting to the first connection ports, the second connection ports being electrically connected to at least one conductive element to converge and deliver output of the power supplies; and
    a second circuit board which is electrically connected to the conductive element and has at least one transformation circuit to regulate power passing through the second circuit board to supply at least one output power to drive a load.

2. The output structure for a redundant power system of claim 1, wherein the conductive element has at least one anchor end, the first circuit board and the second circuit board having at least one anchor zone coupling with the anchor end.

3. The output structure for a redundant power system of claim 2, wherein the conductive element is formed by coupling two metal conductors which have respectively a connection end corresponding and connecting to each other.

4. The output structure for a redundant power system of claim 3, wherein the connection end has a screw hole to receive a fastening element to form a secure fastening.

5. The output structure for a redundant power system of claim 2, wherein the conductive element is an integrated metal conductor and has at least two anchor ends.

6. The output structure for a redundant power system of claim 1, wherein the second circuit board is coupled with at least one power output portion to connect the load.

7. The output structure for a redundant power system of claim 6, wherein the power output portion is electrically connected to the transformation circuit to transport and transform the output power from the transformation circuit.

8. The output structure for a redundant power system of claim 7, wherein the power output portion is electrically connected to the second circuit board and the transformation circuit to receive the output power from the conductive element and deliver the output power at different potentials provided by the transformation circuit.

9. The output structure for a redundant power system of claim 6, wherein the second circuit board has a plurality of transformation circuits to provide independent output power with at least two different potentials to the power output portion.

10. The output structure for a redundant power system of claim 6, wherein the power output portion is a plurality of power cords.

11. The output structure for a redundant power system of claim 6, wherein the power output portion is a plurality of output ports.

12. The output structure for a redundant power system of claim 1, wherein the second circuit board is located at one side of the first circuit board in a parallel manner, the conductive element bridging the second circuit board and the first circuit board in a sideward manner.

13. The output structure for a redundant power system of claim 1, wherein the power supplies include at least one real power supply and at least one virtual power supply.

* * * * *